(12) United States Patent
Santillan et al.

(10) Patent No.: US 11,362,504 B2
(45) Date of Patent: Jun. 14, 2022

(54) OVER CURRENT SENSING SCHEME FOR SWITCH APPLICATIONS

(71) Applicant: Analog Devices International Unlimited Company, Limerick (IE)

(72) Inventors: Jofrey Generalao Santillan, Iligan (PH); David Aherne, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/933,834

(22) Filed: Jul. 20, 2020

(65) Prior Publication Data
US 2022/0021196 A1 Jan. 20, 2022

(51) Int. Cl.
*H02H 3/02* (2006.01)
*G01R 31/327* (2006.01)
*H01H 89/00* (2006.01)

(52) U.S. Cl.
CPC ......... *H02H 3/021* (2013.01); *G01R 31/3274* (2013.01); *H01H 89/00* (2013.01)

(58) Field of Classification Search
CPC ..... H02H 3/021; G01R 31/3274; H01H 89/00
USPC ............................... 361/115, 93.1
See application file for complete search history.

(56) References Cited

U.S. PATENT DOCUMENTS

| | | | |
|---|---|---|---|
| 5,113,089 A | 5/1992 | Osawa | |
| 5,621,601 A * | 4/1997 | Fujihira | H03K 17/0828 361/115 |
| 5,903,422 A * | 5/1999 | Hosokawa | G01R 19/0092 327/543 |
| 6,621,259 B2 | 9/2003 | Jones et al. | |
| 6,747,505 B1 * | 6/2004 | Gergintschew | H03K 17/164 327/427 |
| 6,992,473 B2 | 1/2006 | Marschalkowski et al. | |
| 7,218,496 B2 * | 5/2007 | Kitagawa | H02H 9/02 361/96 |
| 7,259,951 B2 * | 8/2007 | Arai | H03K 17/0822 361/93.7 |
| 7,336,085 B2 * | 2/2008 | Fabbro | H03K 17/18 324/691 |
| 7,365,559 B2 * | 4/2008 | Colbeck | G01R 19/0092 340/635 |
| 7,453,680 B2 | 11/2008 | Hallak et al. | |
| 7,986,149 B2 * | 7/2011 | Covalenco | G01R 31/52 324/555 |
| 8,354,835 B2 | 1/2013 | McNamara | |

(Continued)

OTHER PUBLICATIONS

Itakura; 2003-297939; Oct. 17, 2003; Title: overheat detector circuit for semiconductor integrated circuit, varies reference voltage according to control signal from overcurrent detector circuit (Year: 2003).*

*Primary Examiner* — Dharti H Patel
(74) *Attorney, Agent, or Firm* — Wolf, Greenfield & Sacks, P.C.

(57) ABSTRACT

Circuits and methods for protecting against over-current conditions of switches are described. Over-current conditions can damage switches and the circuits they connect. Some embodiments of the present application provide a sense switch in parallel with the load switch. The sense switch is smaller than the load switch, and is used to sense an over-current condition of the load switch. The sense switch can remain on even when the load switch is turned off in response to detection of an over-current condition.

20 Claims, 14 Drawing Sheets

(56) References Cited

U.S. PATENT DOCUMENTS

| | | | |
|---|---|---|---|
| 8,493,702 B2 * | 7/2013 | Nakahara | H03K 17/0822 |
| | | | 361/93.9 |
| 8,710,541 B2 | 4/2014 | Aherne et al. | |
| 9,621,156 B2 | 4/2017 | Aherne | |
| 10,277,223 B2 | 4/2019 | Santillan et al. | |
| 10,642,769 B2 | 5/2020 | Lofamia et al. | |
| 2006/0250153 A1 * | 11/2006 | Colbeck | G01R 19/0092 |
| | | | 324/762.09 |
| 2007/0195476 A1 | 8/2007 | Sander | |

\* cited by examiner

OVER CURRENT SENSING SCHEME FOR SWITCH APPLICATIONS

FIELD OF THE DISCLOSURE

The present application relates to circuits and methods for sensing fault conditions in switch applications.

BACKGROUND

Many electronic devices or systems include switches to electrically connect or disconnect two or more components. Fault conditions can arise in these systems, for example, when too great a current passes through these switches. This can occur when there is a short circuit in one of the components connected to the switch causing excessive current to pass through the switch. These fault conditions can damage the switch as well as one or all of the components connected through the switch from, for example, overheating due to the excessive current.

SUMMARY OF THE DISCLOSURE

In some embodiments, circuits and methods for protecting against over-current conditions of switches are described. Over-current conditions can damage switches and the circuits they connect. Some embodiments of the present application provide a sense switch in parallel with the load switch. The sense switch is smaller than the load switch, and is used to sense an over-current condition of the load switch. The sense switch can remain on even when the load switch is turned off in response to detection of an over-current condition.

In some embodiments, a circuit for sensing a fault condition in an electronic system is provided, the circuit comprising: a load switch having a first terminal and a second terminal and configured to switchably conduct current between the first and second terminals of the load switch; a sense switch in parallel with the load switch and configured to switchably conduct current between the first and second terminals of the load switch; and a comparison circuit coupled to the sense switch and configured to produce a comparison signal indicative of a relative value of a voltage across the sense switch compared to a reference value.

In some embodiments, a circuit for sensing a fault condition in an electronic system is provided, the circuit comprising: a load switch having a first terminal and a second terminal and configured to switchably conduct a first current between the first and second terminals of the load switch; a sense switch in parallel with the load switch and configured to switchably conduct a second current, the load switch and sense switch being configured such that the first and second currents are combined; and a comparison circuit coupled to the sense switch and configured to produce a comparison signal indicative of relative value of a voltage across the sense switch compared to a reference value.

In some embodiments, a method for sensing a fault condition in an electronic system is provided, the method comprising: switchably conducting current between a first terminal and a second terminal of a load switch through the load switch; switchably conducting current between the first and second terminals of the load switch through a sense switch; and producing a comparison value by comparing a voltage across the sense switch and a reference voltage.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

According to an aspect of the present application, sensing circuits and methods are provided by a sense switch in parallel with a load switch such that during a fault condition (e.g., a current passing through the load switch that exceeds a desired threshold), the load switch can be put in an off state independent of the sense switch, which can remain in an on state throughout the duration of the fault condition. By remaining in an on state for all or part of the fault condition, rather than turning off during the fault condition, the sense switch can allow safe or limited current to pass through the sense switch (referred to herein as a "bleed current") while the sense switch can continue to be monitored to determine if and when the fault condition has passed. This allows for rapid determination of when the fault condition has passed, so that the load switch can be turned on again without being damaged.

An exemplary application of the protection techniques disclosed in the present application is for use with one or more load switches serving as a protection device between a field-programmable gate array ("FPGA"), microprocessor, or application specific integrated circuit ("ASIC") and another component, such a component connected through an SPI or USB interface, timers, encoders, or digitizers. If an error occurs, like mis-wiring or misalignment, it may result in one of the nodes shorted to ground or another electrical potential at the load switch that causes large current flow from one of the devices connected to the load switch. This current may exceed a level of current that these devices can support without risking damage. In this situation, the load switch should be turned off to avoid large current drawn from the source, which may damage a component connected to the load switch (e.g., an FPGA driver circuit). The load switch can be turned on when measurements based on the sense switch, which can remain in an on state, indicate that the fault condition has been addressed.

Figure 1A:
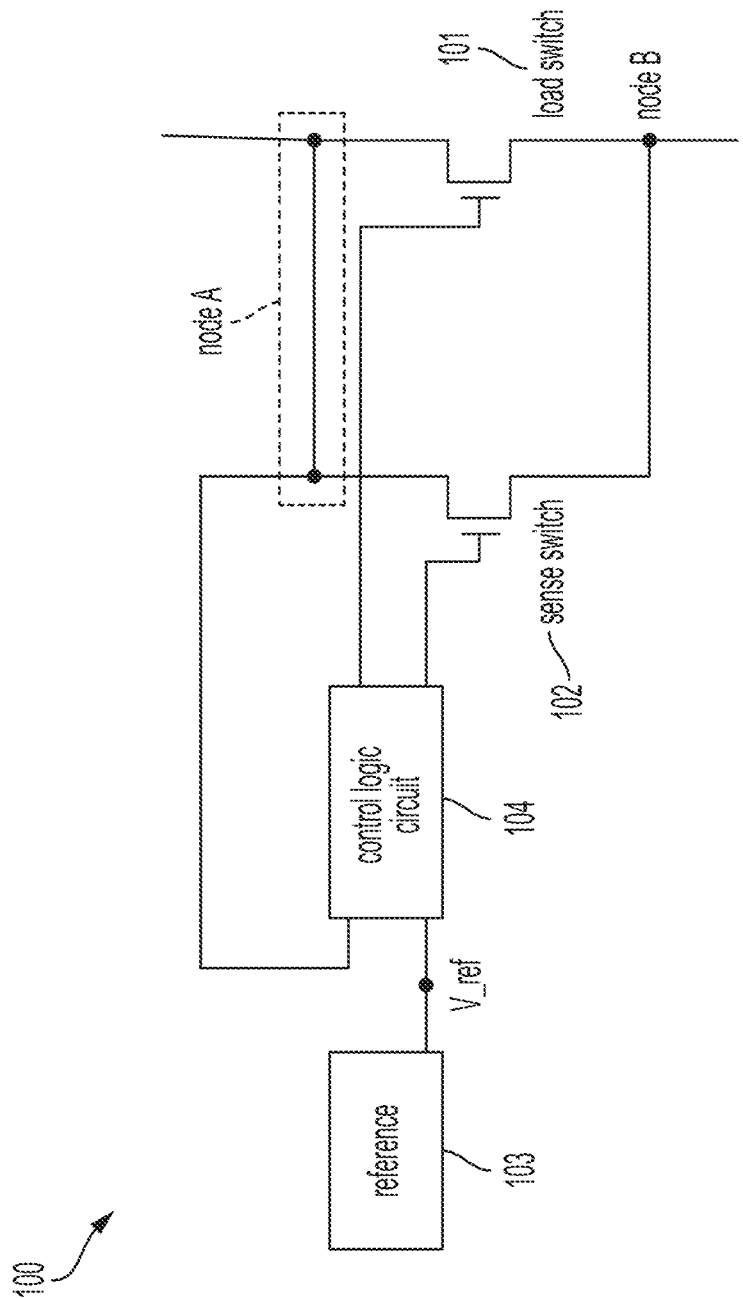
FIG. 1A is a circuit diagram of an over-current sensing circuit with a load switch, a sense switch in parallel with the load switch, a reference source, and a logic circuit, according to a non-limiting embodiment of the present application.

FIG. 1A illustrates over-current sensing circuit according to a non-limiting embodiment of the present application. The over-current sensing circuit 100 comprises a load switch 101, a sense switch 102 in parallel with load switch 101, a reference source 103, and a control logic circuit 104 coupled to sense switch 102 and reference source 103.

Load switch 101 and sense switch 102 are illustrated as enhancement mode MOSFETs, though any known switching devices may be used (e.g., depletion mode MOSFETs, FinFETs, BJTs, IGBTs, etc.). Sense switch 102 preferably has a larger on-state resistance than load switch 101. For example, the on-state resistance of sense switch 102 can range from about 10 times to about 10,000 times the on-state resistance of load switch 101. As a result, when both switches are in an on state and operating normally, current through sense switch 102 may be approximately 1/10 to 1/10,000 of parallel current through load switch 101. Sense switch 102 can also be sized to have a sufficiently large on state resistance so that the corresponding bleed current does not damage sense switch 102 or any components in the path of the bleed current.

During normal operating conditions, load switch 101 and sense switch 102 can both be in an on state and the drain-to-source voltage across sense switch 102 (Vds_sen) should be less than or equal to the voltage provided by reference source 103 (V_ref). V_ref should preferably be set to the value of Vds_sen that indicates a fault condition at load switch 101. This value can be determined experimentally or can be calculated based on the maximum current through load switch 101 deemed to be acceptable under normal operating conditions. V_ref may be fixed or adjustable. An adjustable V_ref will allow adjustments that account for any manufacturing variations or time-dependent degradations that may occur to any of the components of the sensing circuit. V_ref produced by reference source 103 is provided to control logic circuit 104.

To detect a fault condition at load switch 101, control logic circuit 104 compares Vds_sen to V_ref. When a fault condition occurs at load switch 101, the current through load switch 101 and sense switch 102 will begin to increase, thereby causing a corresponding increase in Vds_sen. Once control logic circuit 104 detects that Vds_sen exceeds V_ref by more than a threshold value (which may be set to zero), a fault condition at load switch 101 has been detected. The detected fault condition can be used to produce one or more signals that cause load switch 101 to be placed in an off condition, for example by control logic circuit 104 producing a voltage at the gate of load switch 101 that turns off load switch 101. Placing load switch 101 in an off condition can protect load switch 101 and any components connected to load switch 101 by limiting or removing the current that is conducted through load switch 101 during the fault condition. Sense switch 102, however, can remain in an on-state condition during the fault condition because its higher resistance means that sense switch 102 should only be conducting the bleed current when load switch 101 is turned off. Once the fault condition has been addressed (e.g., a short circuit has been removed), Vds_sen will begin to reduce and once it becomes equal to or less than V_ref by more than another threshold value (where this threshold may be the same as or different from the threshold value used to detect a fault condition), control logic circuit 104 detects that there is no longer a fault condition at load switch 101, which is information that can be used to produce a signal that causes load switch 101 to return to an on-state condition (e.g., control logic circuit 104 can produce a voltage at the gate of load switch 101 that turns it on).

Figure 1B:
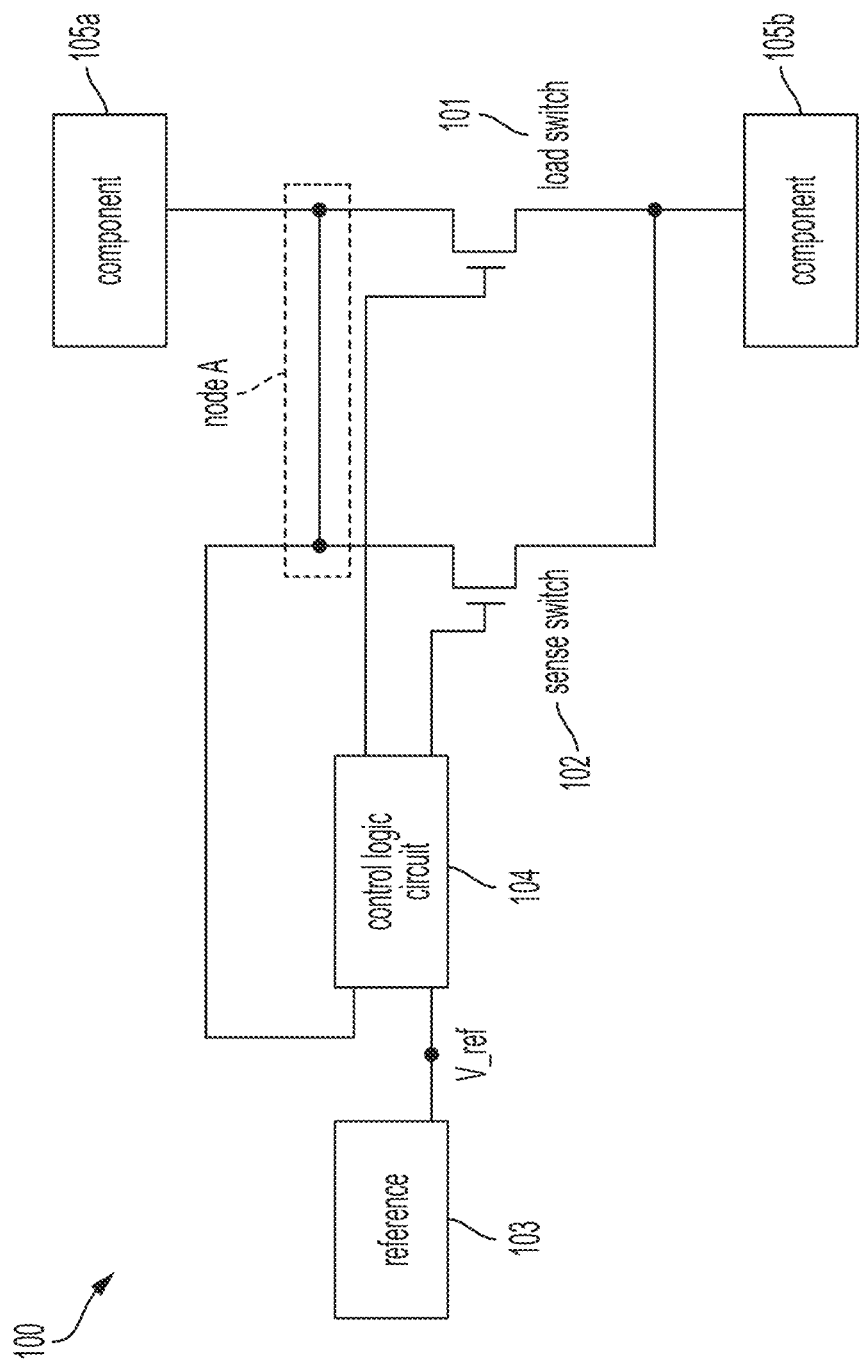
FIG. 1B is a non-limiting embodiment of the over-current sensing circuit of FIG. 1A, including two electrical components electrically coupled to the terminals of the load switch and sense switch.

FIG. 1B shows a further non-limiting embodiment of sensing circuit 100, which is the same as the embodiment in FIG. 1A except component 105a is coupled to a source/drain terminal of load switch 101 and a source/drain terminal of sense switch 102 and component 105b is coupled to the alternative source/drain terminals of load switch 101 and sense switch 102. Examples of component 105a can be an FPGA, microprocessor, or an ASIC. Examples of components 105b can be a circuit or electrical component connected through an SPI or USB interface, timers, encoders, or digitizers. However, any electrical circuit, component, or input/output circuit or device can be used as component 105a and component 105b. For convenience, component 105a and component 105b will not be illustrated in subsequent embodiments discussed in the present application, though it should be understood that either or both may be coupled to the load switch(es) any of the sensing circuits of the present application.

Figure 2:
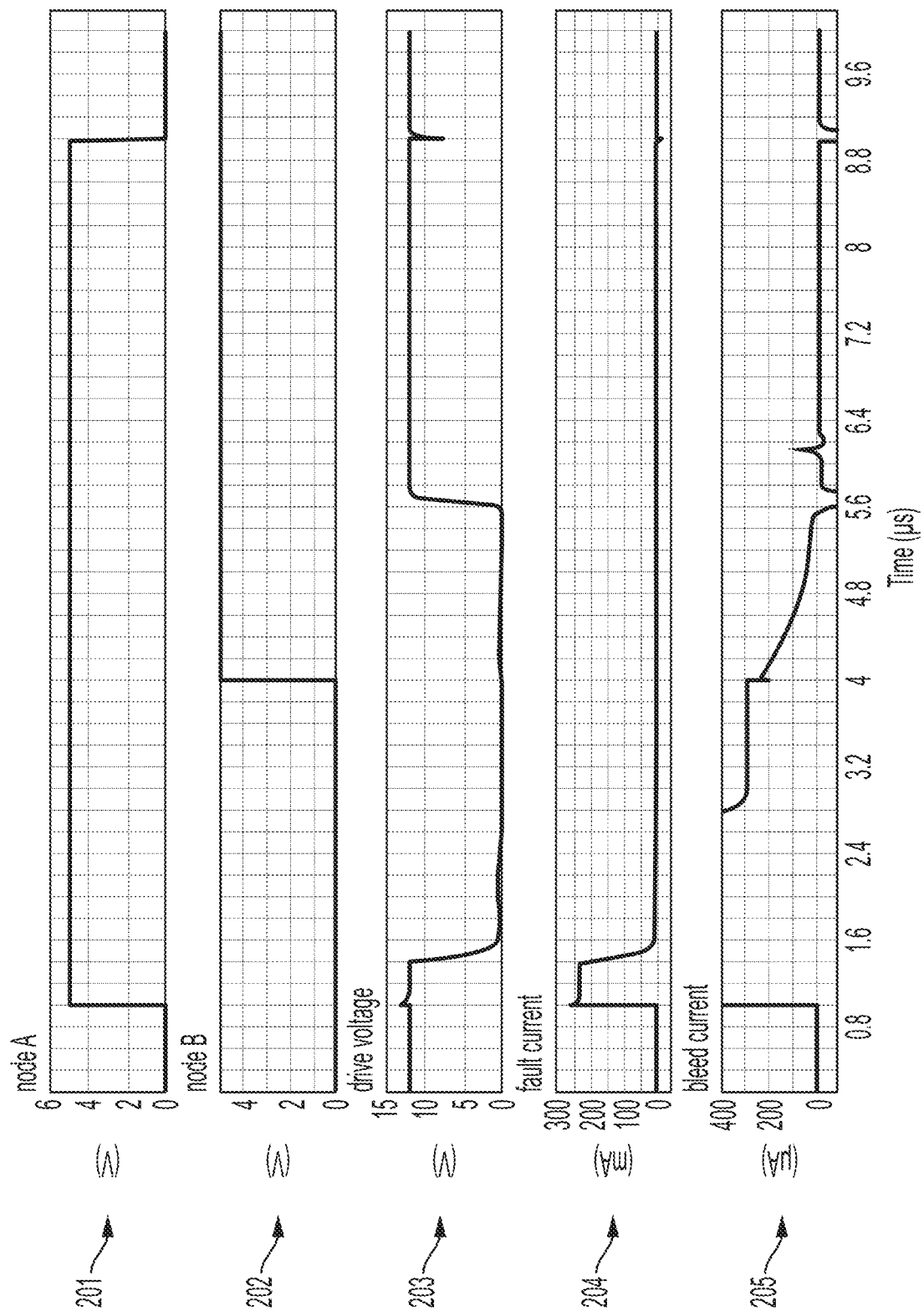
FIG. 2 is a timing diagram for the over-current sensing circuit of FIG. 1A showing the operation of the sensing circuit when an over-current event occurs at the load switch.

FIG. 2 is a timing diagram for the over-current sensing circuit 100 of FIG. 1A showing the operation of the sensing circuit when an over-current event occurs at the load switch. FIG. 2 shows voltage 201, which is the voltage at Node A in FIG. 1A, voltage 202, which is the voltage at Node B in FIG. 1A, drive voltage 203, which is the voltage at the gate of load switch 101, fault current 204, which is the current through load switch 101, and bleed current 205, which is the current through sense switch 102. FIG. 2 illustrates the over current sensing operations previously described with respect to FIG. 1A. Though not illustrated, in the timing diagram example illustrated by FIG. 2, V_ref is set to 0V and the thresholds to detect a fault condition and indicate that the fault condition are set to 0V (i.e., a fault condition is indicated by Vds_sen being greater than 0V and the fault condition being addressed is indicated by Vds_sen being equal to 0V).

At time 0.8 μs a fault condition (e.g., a short to ground occurring at Node B) causes fault current 204 to rapidly rise to approximately 250 mA. At the same time, bleed current 205 rapidly rises as well and voltage 201 rises to approximately 5V rise (i.e., Vds_sen, the difference between voltage 201 and voltage 202, begins to increase). Shortly thereafter, at approximately time 1.2 μs, drive voltage 203 is reduced to 0 V by control logic circuit 104, thereby turning off load switch 101 and causing fault current 204 to rapidly drop to 0 mA. At time 4 µs, the fault condition has been addressed, causing bleed current 205 to begin to decrease and voltage 202 to begin to rise (i.e., Vds_sen, the difference between voltage 201 and voltage 202, begins to decrease). At approximately time 5.6 µs, voltage 202 has reached 5V, the same as voltage 201 (i.e., Vds_sen is now 0V), indicating to control logic circuit 104 that the fault condition has been addressed and that load switch 101 can be turned on again, which, as indicated by drive voltage 203, occurs shortly after time 5.6 µs.

Figure 3:
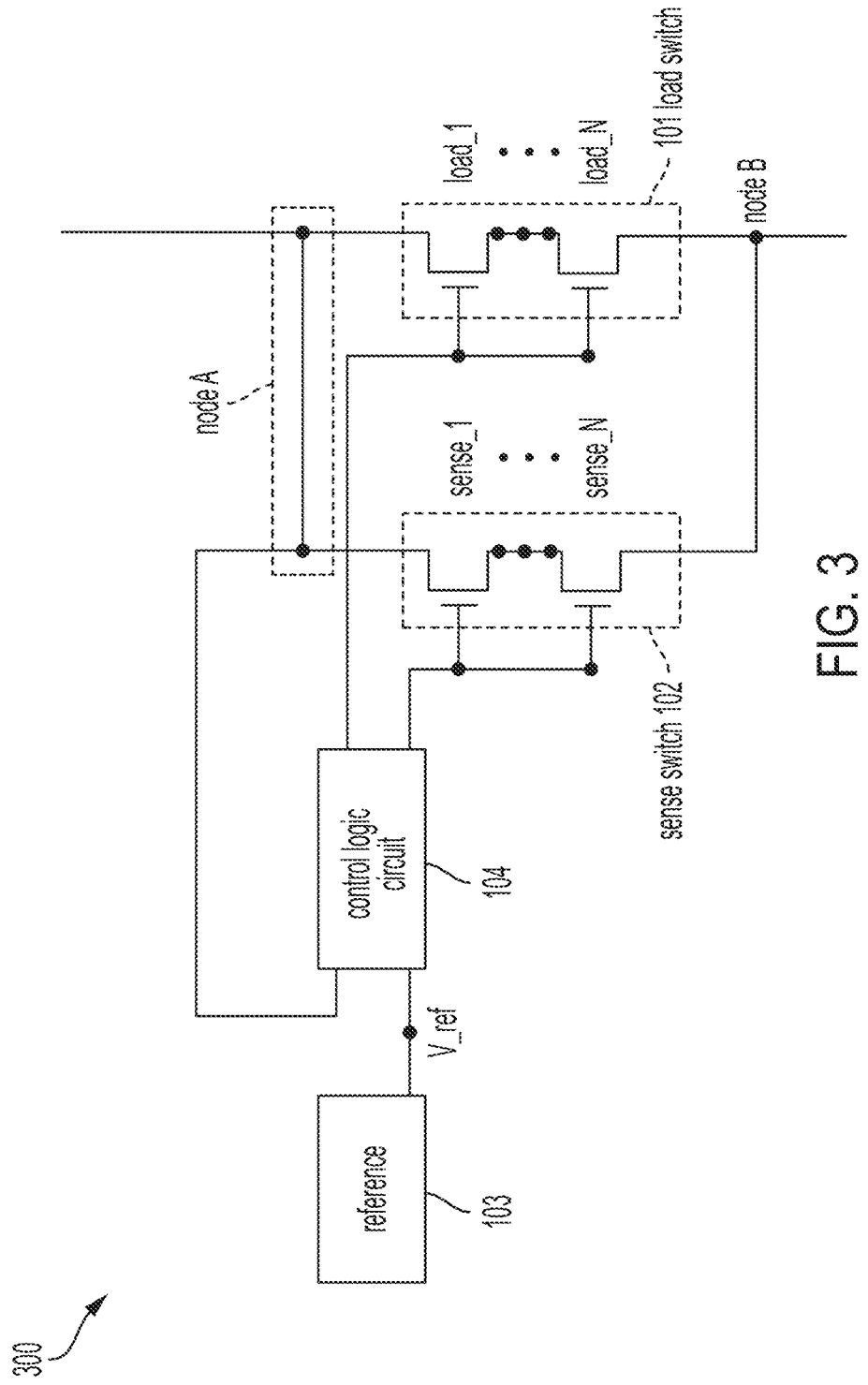
FIG. 3 is a non-limiting embodiment of an over-current sensing circuit where the sense switch comprises a plurality of sub switches connected in series and the load switch comprises a plurality of sub switches connected in series.

Though load switch 101 and sense switch 102 have been illustrated as individual switches, either or both of these switches may comprise a plurality of switches. FIG. 3 shows a further embodiment illustrating sensing circuit 300 in which both the load switch and the sense switch comprise a plurality of switches, which may be referred to as "sub switches." Specifically, in the non-limiting example illustrated in FIG. 3, load switch 101 comprises a plurality of switches load_1 through load_N connected in series and sense switch 102 comprises a plurality of switches sense_1 through sense_N connected in series. The fault condition sensing scheme for this arrangement as shown in FIG. 3 differs from that of FIG. 1 in that current through switches load_1 through load_N is controlled by a common control signal coupled to control logic circuit 104 and current through switches sense_1 through sense_N is controlled by a different common control signal coupled to logic circuit 104. However, load_1 through load_N and sense_1 through sense_N can be coupled to control logic circuit 104 through individual (or groups of) control signals, allowing each switch (or group of switches) to be separately controllable.

Figure 4:
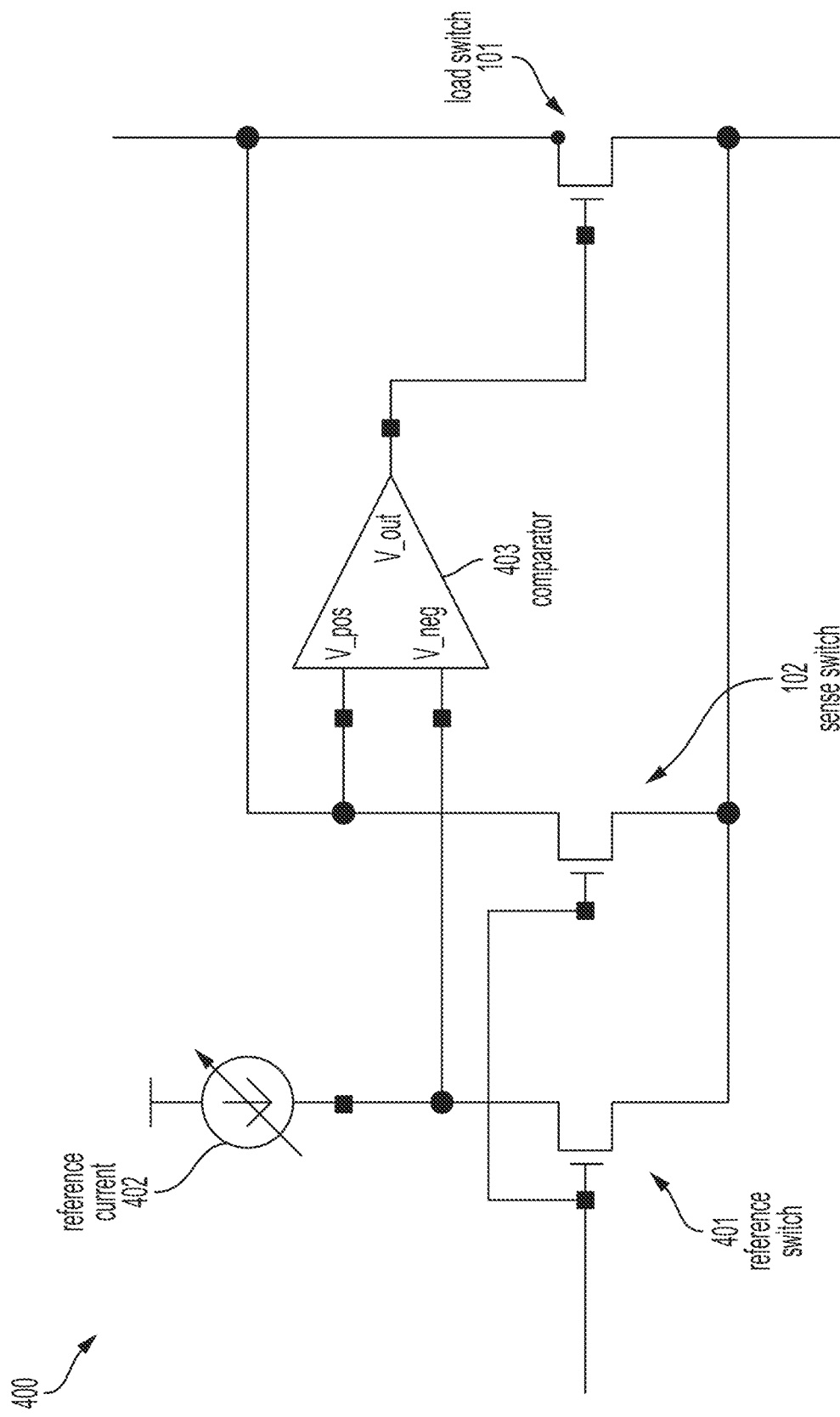
FIG. 4 is a non-limiting embodiment of an over-current sensing circuit where the reference value is based on a reference switch and a variable current source and the conducting state of the load switch is controlled by a comparator circuit.

FIG. 4 shows sensing circuit 400, a non-limiting implementation of the sensing circuit of FIG. 1A. Sensing circuit 400 comprises a reference in the form of a reference switch 401 and a reference current 402. The control logic is implemented as a comparator 403. Sensing circuit 400 further comprises load switch 101 and sense switch 102 in parallel with load switch 101. Reference current 402 is coupled to reference switch 401, and comparator 403 is coupled to load switch 101, sense switch 102, reference switch 401, and reference current 402. One input node of comparator 403 (V_pos) is coupled to a source/drain terminal of load switch 101 and a source/drain terminal of sense switch 102. The other input node of comparator 403 (V_neg) is coupled to the source/drain terminal of reference switch 401 that is coupled to reference current 402. The output node of comparator 403 (V_out) is coupled to the gate terminal of load switch 101. Comparator 403 will also be coupled to power supplies or a power supply and ground, though these connections are not illustrated in FIG. 4.

Each of load switch 101, sense switch 102, and reference switch 401 may be an enhancement mode MOSFET (or plurality of enhancement mode MOSFETs), though any known switching devices may be used. Comparator 403 is illustrated as an operational amplifier that compares the voltages at its inputs nodes (V_pos and V_neg). Depending on this comparison, comparator 403 will output different voltages at its output node (V_out). One possible value of V_out is preferably a voltage that places load switch 101 in an on-state condition, whereas another possible value of V_out is preferably a voltage that places load switch 101 in an off-state condition. For example, V_out can equal 0V when the voltage at node V_pos exceeds V_neg, whereas V_out can equal +5V when V_pos is equal to or less than V_neg.

Reference switch 401 is preferably sized to have the same device characteristics as sense switch 102 so that when the same magnitude of current passes through each switch, the drain-to-source voltage across sense switch 102 (Vds_sen) is the same magnitude as the drain-to-source voltage across reference switch 401 (Vds_ref). As a result, Vds_sen can be compared to Vds_ref in a manner that is normalized against variations in the circuit or surrounding environment that may occur over time (e.g., temperature fluctuations), which may cause the same magnitude of current through each switch to have different magnitudes of drain-to-source voltages. However, differences in device characteristics between sense switch 102 and reference switch 401, whether by design, manufacturing variability, or fluctuations occurring over time, can be accounted for with appropriate adjustments to the voltage comparison described below.

Similar to V_ref supplied by reference source 103 in the embodiment in FIG. 1A, reference current 402 sets the current threshold of sensing circuit 400 and is selected so that the Vds_ref created by reference current 402 corresponds to the Vds_sen that indicates a fault condition at load switch 101.

During normal operating conditions, load switch 101, sense switch 102, and reference switch 401 can all be in an on state. Vds_sen should be less than or equal to Vds_ref, which causes V_pos to be less than V_neg. As a result, comparator 403 produces a logical high value (e.g., +5V) at its output V_out, which keeps load switch 101 in an on-state condition. When a fault condition occurs, Vds_sen, and therefore V_pos, will begin to increase. When V_pos exceeds V_neg, comparator 403 will produce a logical low value (e.g., 0V) at its output node V_out, which will place load switch 101 in an off-state condition. However, sense switch 102 and reference switch 401 can remain in on-state conditions. Once the fault condition has been addressed, Vds_sen and V_pos will begin to decrease. When V_pos becomes less than or equal to V_neg, comparator 403 will again produce a logical high value (e.g., +5V) at its output node V_out, which causes load switch 101 to return to an on-state condition.

Figure 5:
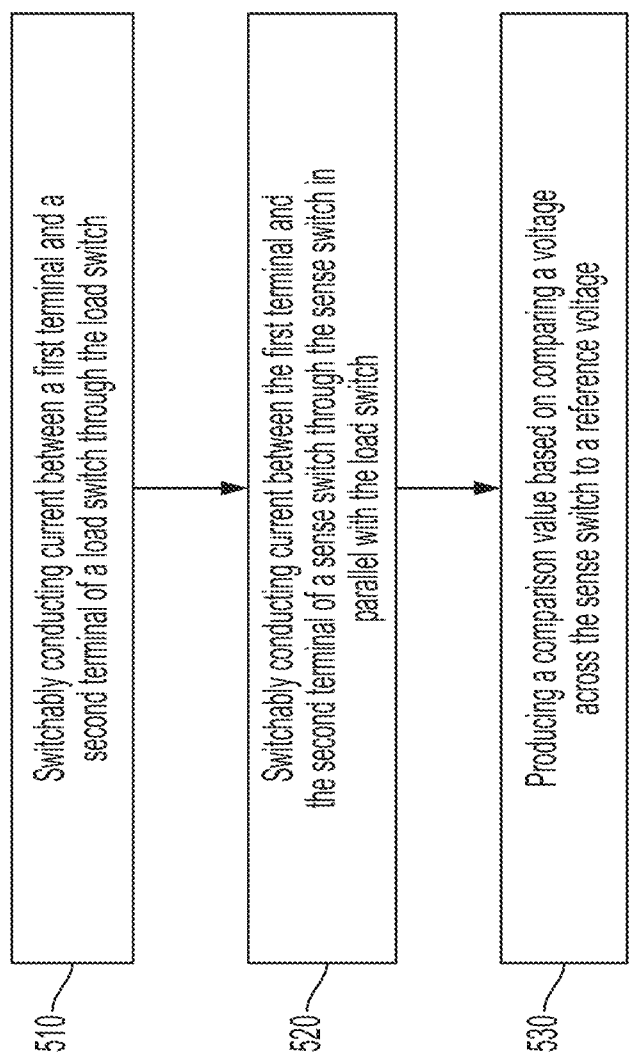
FIG. 5 is a flow diagram of a method of sensing over-current in a load switch, in accordance with various embodiments.

FIG. 5 shows a non-limiting example flow diagram of steps that may be performed in order to sense over-current in a load switch, in accordance with various embodiments. The method comprises steps 510, 520, and 530. The steps may be implemented in any order and independently of any other step. Step 510 includes switchably conducting current between a first terminal and a second terminal of a load switch through the load switch. The load switch may be any of the types described previously herein. For example, the load switch may be one or more enhanced mode MOSFETs. Step 520 includes switchably conducting current between the first terminal and the second terminal of a sense switch through the sense switch in parallel with the load switch. The sense switch may be any of the types described herein. For example, the sense switch may be one or more enhanced mode MOSFETs. Steps 530 includes producing a comparison value based on comparing a voltage across the sense switch to a reference voltage. The reference voltage may be produced using any of the implementations described herein. For example, the reference voltage may be produced by a fixed voltage source. Alternatively, the reference voltage may be produced using a reference current and a reference switch. The comparison in Step 530 may be performed using any of the implementations described herein. For example, the comparison can be performed by a control logic circuit. Alternatively, the comparison may be performed by an operational amplifier.

The fault condition sensing technique described herein can also be used in a bi-directional sensing circuit that can detect fault conditions that arise from problems (e.g., short circuits) occurring on either side or both sides of the source/drain terminals of a load switch. In other words, a fault condition can be detected irrespective of what side of the source/drain terminal of the load switch the fault condition occurs.

Figure 6:
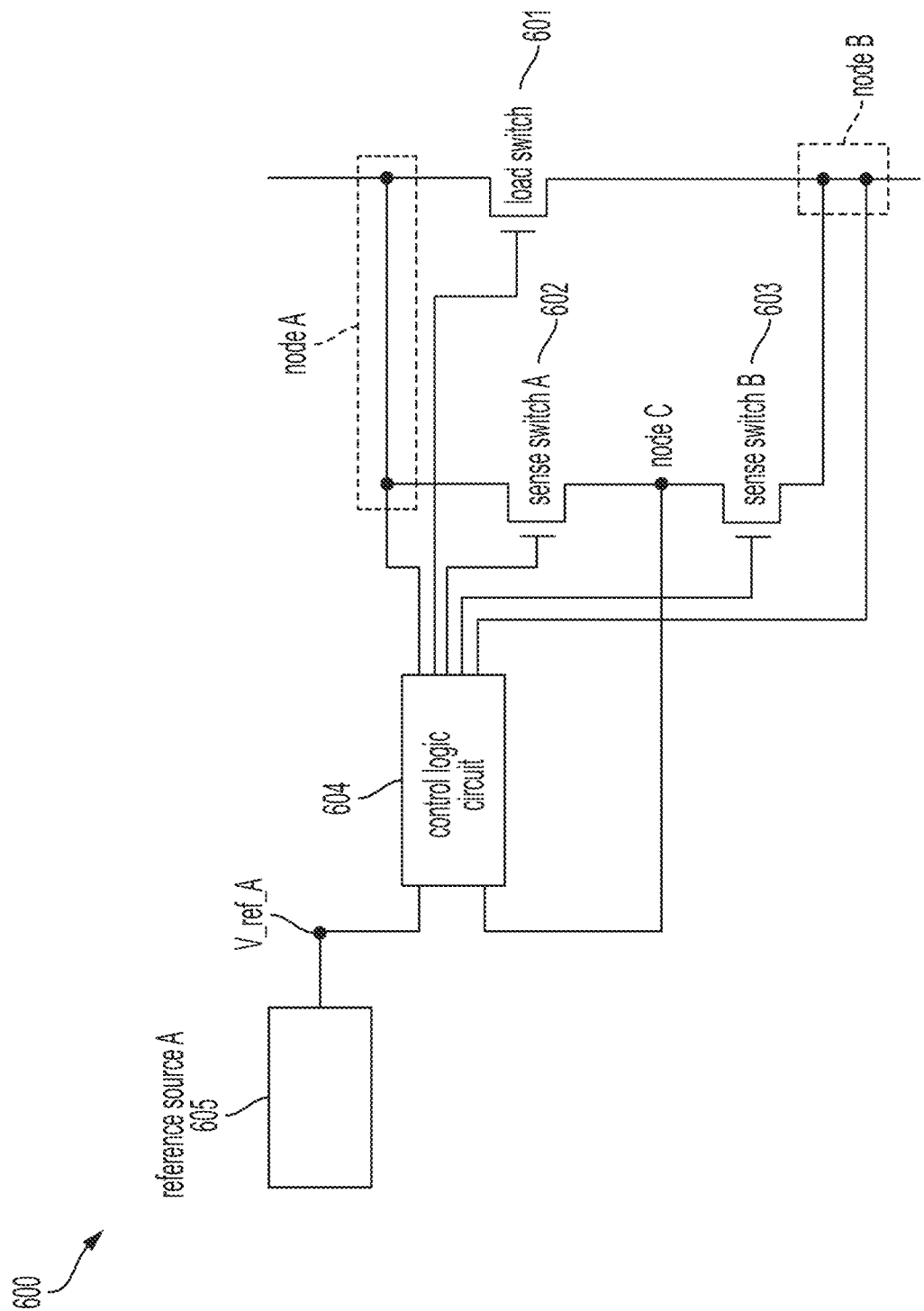
FIG. 6 is a non-limiting embodiment of an over-current sensing circuit that can operate bi-directionally to detect an overcurrent event caused at either side of the conducting path through the load switch.

FIG. 6 shows a further embodiment illustrating bi-directional sensing circuit 600, which is based on the embodiment in FIG. 1A. The fault condition sensing scheme for bi-directional sensing circuit as shown in FIG. 6 differs from that of FIG. 1A in that a fault condition current through a load switch 601 can be detected based on faults that originate on either source/drain terminal of load switch 601.

Bi-directional sensing circuit 600 comprises load switch 601, a sense switch A 602 in parallel with load switch 601, a sense switch B 603 in parallel with load switch 601 and in series with sense switch A 602, a reference source A 605, and a control logic circuit 604 coupled to load switch 601, sense switch A 602, sense switch B 603, and reference source A 605. Control logic circuit 604 is also coupled to a node (labeled node C) in series with and between the source/drain terminals of sense switch A 602 and sense switch B 603.

Sense switch A 602 is used to detect a fault condition that originates from the circuit or components connected to the node (labeled node A) electrically coupled to load switch 601 and sense switch A 603. Sense switch B 603 is used to detect a fault condition that originates from the circuit or components connected to the node (labeled node B) electrically coupled to load switch 601 and sense switch B 603. Control logic circuit 604 compares the voltage across sense switches A 602 and B 603 to reference source A 605.

During normal operating conditions, load switch 601, sense switch A 602, and sense switch B 603 can each be in an on state. The drain-to-source voltage across sense switch A 602 (Vds_sen_A) should be less than or equal to the voltage provided by reference source A 605 (V_ref_A). Similarly, the drain-to-source voltage across sense switch B 603 (Vds_sen_B) should be less than or equal to the voltage provided by reference source A 605 (V_ref_A). V_ref_A should preferably be set to the value of Vds_sen_A that indicates a fault condition at load switch 601 that originates from the circuit or component coupled to load switch 601 at Node A. The value of V_ref_A can be determined experimentally or can be calculated based on the maximum current through load switch 601 deemed to be acceptable under normal operating conditions. V_ref_A may be fixed or adjustable. Adjustable V_ref_A will allow adjustments that account for any manufacturing variations or time-dependent degradations that may occur to any of the components of the sensing circuit. V_ref_A produced by reference source A 605 is provided to control logic circuit 604.

To detect a fault condition at load switch 601, control logic circuit 604 compares Vds_sen_A and Vds_sen_B to V_ref_A. When a fault condition occurs at load switch 601, the current through load switch 601, sense switch 602, and sense switch 603 will begin to increase, thereby causing a corresponding increase in Vds_sen_A and Vds_sen_B. Once control logic circuit 604 detects that Vds_sen_A or Vds_sen_B exceeds V_ref_A by more than a first threshold value (which may be set to zero), a fault condition at load switch 601 has been detected. The detected fault condition can be used to produce one or more signals that cause load switch 601 to be placed in an off condition, for example, by control logic circuit 604 producing a voltage at the gate of load switch 601 that turns off load switch 601. Placing load switch 601 in an off condition can protect load switch 601 and any components connected to load switch 601 by limiting or removing the current that is conducted through load switch 601 during the fault condition. Sense switch 602 A and sense switch B 602, however, can remain in on-state conditions during the fault condition. Once the fault condition has been addressed, Vds_sen_A and Vds_sen_B will begin to reduce. Once Vds_sen_A and Vds_sen_B become less than or equal to V_ref_A by more than a third threshold value (where this threshold may be the same as or different from the first threshold value), control logic circuit 604 detects that there is no longer a fault condition at load switch 601, which is information that can be used to produce a signal that causes load switch 601 to return to an on-state condition (e.g., control logic circuit 604 can produce a voltage at the gate of load switch 601 that turns it on).

While FIG. 6 illustrates a configuration with a single reference voltage, some embodiments utilize two reference voltages, both of which are provided to the control logic circuit. The first reference voltage may be compared to the voltage across sense switch A and the second to the voltage across sense switch B.

Figure 7:
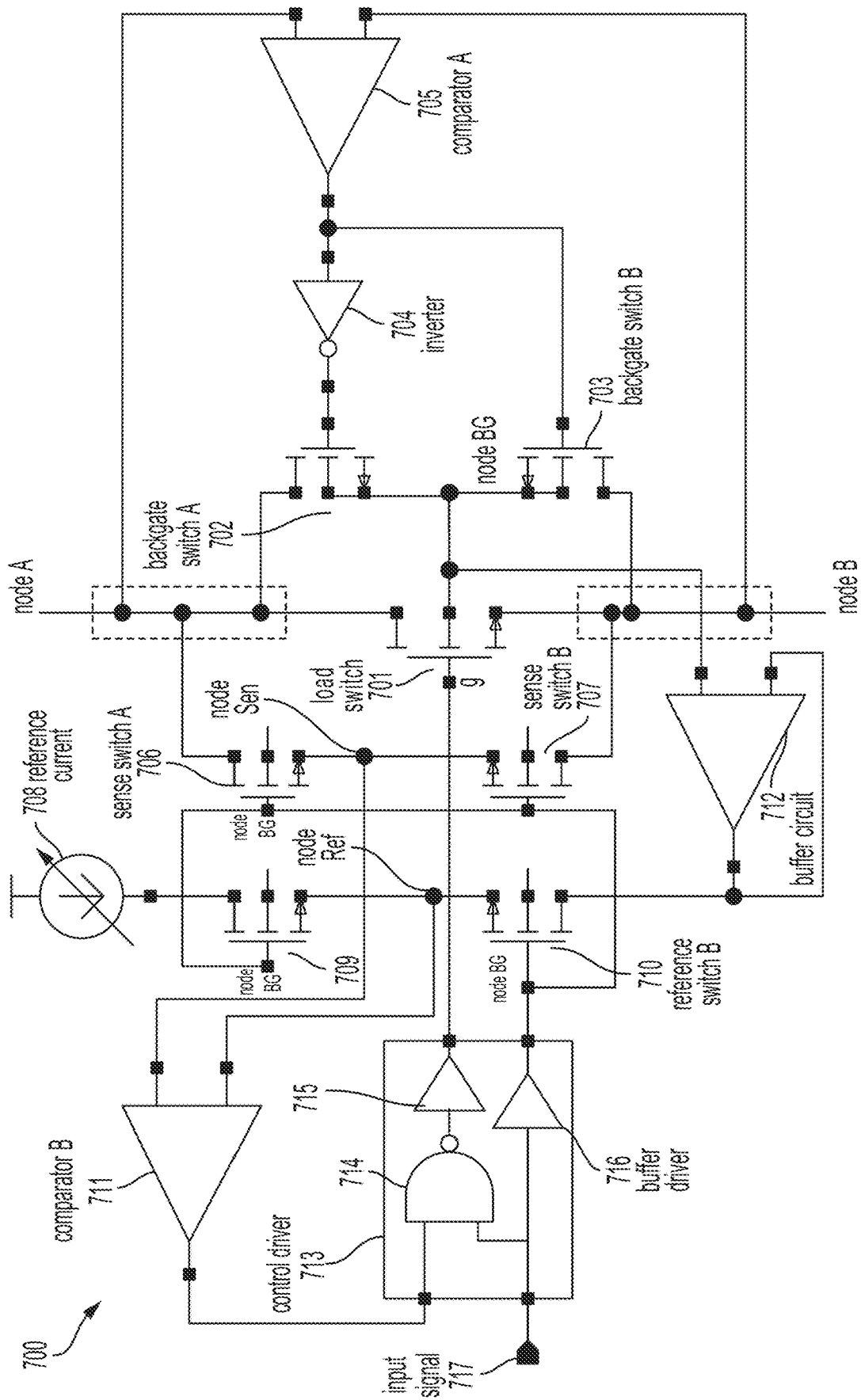
FIG. 7 is a non-limiting alternative embodiment of an over-current sensing circuit that can operate bi-directionally to detect an overcurrent event caused at either side of the conducting path through the load switch.

FIG. 7 shows a further non-limiting embodiment illustrating bi-directional sensing circuit 700, which is based on the embodiments in FIG. 4 and FIG. 6. Sensing circuit 700 comprises a load switch 701, a backgate switch A 702, a backgate switch B 703, an inverter 704, a comparator A 705, a sense switch A 706, a sense switch B 707, a reference current 708, a cascode 709 (for matching sense switch A 706 or sense switch B 707), a reference switch B 710, a comparator B 711, a buffer circuit 712, and a control driver 713 comprised of an NAND gate 714, buffer driver 715, and a buffer driver 716.

The gate of load switch 701 is coupled to the output of buffer driver 715. One source/drain terminal of load switch 701 is coupled to a node (labeled node A) that is coupled to one source/drain terminal of backgate switch A 702, one source/drain terminal of sense switch A 706, and one input node of comparator A 705. The other source/drain terminal of load switch 701 is coupled to a node (labeled node B) that is coupled to one source/drain terminal of backgate switch B 703, one source/drain terminal of sense switch B 707, and the other input node of comparator A 705. The backgate terminal of load switch 701 is coupled to a node (labeled Node BG) that is coupled to the other source/drain terminal of backgate switch B 703, the other source/drain terminal of backgate switch B 704, and one input node of buffer circuit 712.

The gate of backgate switch A 702 is coupled to the output of inverter 704. The gate of backgate switch B 703 is coupled to the input of inverter 704 and the output of comparator A 705. Backgate switch A 702 and backgate switch B 703 are illustrated as enhancement mode MOSFETs, though any known switching devices may be used (e.g., depletion mode MOSFETs, FinFETs, BJTs, IGBTs, etc.).

The other source/drain terminal of sense switch A 706 is coupled to a node (labeled node Sen) that is coupled to the other source/drain terminal of sense switch B 707 and one input terminal of comparator B 711. One source/drain terminal of cascode 709 is coupled to reference current 708. The other source/drain terminal of cascode 709 is coupled to a node (labeled node Ref) that is coupled to the other input node of comparator 711 and one source/drain terminal of reference switch B 710. The other source/drain terminal of reference switch B 710 is coupled to the output of buffer circuit 712 and the other input node of buffer circuit 712.

The gates of sense switch A 706, sense switch B 707, cascode 709, and reference switch B 710 are coupled to the output of buffer driver 716. However, in alternative embodiments, the gates of sense switch A 706, sense switch B 707, cascode 709, and reference switch B 710 can be coupled to separate or groups of driver sources.

The output of comparator B 711 is coupled to one input of NAND gate 714. The other input of NAND gate 714 is coupled to an input signal 717 and the input of buffer driver 716.

Similar to the embodiment in FIG. 4, reference switch B 710 is preferably sized to have the same device characteristics as sense switch A 706 so that when the same magnitude of current passes through each switch, the drain-to-source voltage across sense switch A 706 (Vds_sen_A) is the same magnitude as the drain-to-source voltage across reference switch B 710 (Vds_ref_B). Similarly, reference switch B 710 is preferably sized to have the same device characteristics as sense switch B 707 so that when the same magnitude of current passes through each switch, the drain-to-source voltage across sense switch B 707 (Vds_sen_B) is the same magnitude as the drain-to-source voltage across reference switch B 710 (Vds_ref_B). As a result, the voltage at Node sen (V_sen) can be compared to the voltage at Node Ref (V_ref) in a manner that is normalized against variations in the circuit or surrounding environment that may occur over time (e.g., temperature fluctuations), which may cause the same magnitude of current through identical switches to have different magnitudes of drain-to-source voltages. However, differences in device characteristics between sense switch A 706 and reference switch B 710 or between sense switch B 707 and reference switch B 710, whether by design, manufacturing variability, or fluctuations occurring over time, can be accounted for with appropriate adjustments to the voltage comparison described below.

Similar to reference current 402 in the embodiment in FIG. 4, reference current 708 sets the current threshold of sensing circuit 700 and is selected so that the V_ref created by reference current 708 corresponds to the V_sen that indicates a fault condition at load switch 701.

Input signal 717 to control driver 713 determines whether sensing circuit 700 is active or inactive. If input signal 717 is a logical low value (e.g., 0V), the output of NAND gate 714 will always be a logical high value regardless of the value at its other input. As a result, the output of buffer driver 715 will be a logical high value (e.g., +5V), thereby placing load switch 701 in an on-state condition. If input signal 717 is a logical high value, then the output of NAND gate 714 will depend on the output of comparator B 711 because it is coupled to the other input of NAND gate 714. If comparator B 711 outputs a logical high value while input 717 is a logical high value, the output of NAND gate 714 will be a logical low value, causing load switch 701 to be in an off-state condition. If, however, comparator B 711 is a logical low value while input 717 is a logical high value, the output of NAND gate 714 will be a logical high value, causing load switch 701 to be in an on-state condition. Though control driver 713 has been illustrated as comprising an NAND gate and two buffer drivers, control driver 713 can be any circuit capable of implementing the control procedure described above. For example, control driver 713 may include other logic combinations, such as an AND gate and an inverter. For all the remaining discussion of the embodiment of FIG. 7, it will be assumed that input signal 717 is set to a value that activates sensing circuit 700.

During normal operating conditions, load switch 701, sense switch A 706, sense switch B 707, cascode 709, and reference switch B 710 can each be in an on state. The drain-to-source voltage across sense switch A 706 (Vds_sen_A) should be less than or equal to the voltage across reference switch B 710 (Vds_ref_B). Similarly, the drain-to-source voltage across sense switch B 607 (Vds_sen_B) should be less than or equal to the drain-to-source voltage across reference switch B 710 (Vds_ref_B). Vds_ref_B should preferably be set to the value of Vds_sen_A that indicates a fault condition at load switch 701 that originates from the circuit or component coupled to load switch 701 at Node A. Vds_ref_B should preferably be set to the value of Vds_sen_B that indicates a fault condition at load switch 701 that originates from the circuit or component coupled to load switch 701 at node B.

Various backgates of some of the switches shown are connected together to node BG. For example, as shown, the backgates of 702, 706, 707, 709 and 710 are all tied to the node BG, as is the source of 702.

During normal operating conditions, V_sen should be less than V_ref. As a result, comparator B 711 produces a logical low high at its output node, which, as described above, places load switch 701 in an on-state.

When a fault condition originates from the circuit or components connected to node A, the current through load switch 701 and sense switch A 706 will begin to increase. This causes the output of comparator 705 to be a logical high value, which causes the output of inverter 704 to be a logical low value. As a result, backgate switch A 702 will be in an off state and backgate switch B 703 will be in an on state and the backgate terminal of load switch 701 will be at the same electric potential as the source/drain terminal of load switch 701 that is coupled to node B. Accordingly, V_sen will begin to increase compared to V_ref. When V_sen exceeds V_ref, comparator B 711 will output a logical high value, which, as described above, places load switch 701 in an off state. Sense switch A 706 and sense switch B 707, however, can each remain in an on-state during the fault condition. Once the fault condition has been addressed, V_Sen will begin to reduce. Once V_Sen becomes less than or equal to V_Ref, comparator B 711 will output a logical low value, which, as described above, will cause load switch 701 to return to an on-state condition.

When a fault condition originates from the circuit or components connected to Node B a similar state occurs. The current through load switch 701 and sense switch B 707 will begin to increase. This causes the output of comparator A 705 to be a logical low value, which causes the output of inverter 704 to be a logical high value. As a result, backgate switch A 702 will be in an on state and backgate switch B 703 will be in an off state and the backgate terminal of load switch 701 will be at the same electric potential as the source/drain terminal of load switch 701 that is coupled to node A. Accordingly, the voltage at V_sen will begin to increase compared to V_ref, which causes load switch 701 to be placed in an off state, as explained above. Once the fault condition has been addressed, V_Sen will begin to reduce, which causes load switch 701 to be placed in an on state, as described above.

Buffer circuit 712 provides a path for the current through cascode 709 and reference switch B 710 to leave sensing circuit 700 through the power supplies connected to buffer circuit 712 (which are not shown in FIG. 7). Though buffer circuit 712 is illustrated as an operational amplifier, any circuit capable of buffering current can be used.

Figure 13:
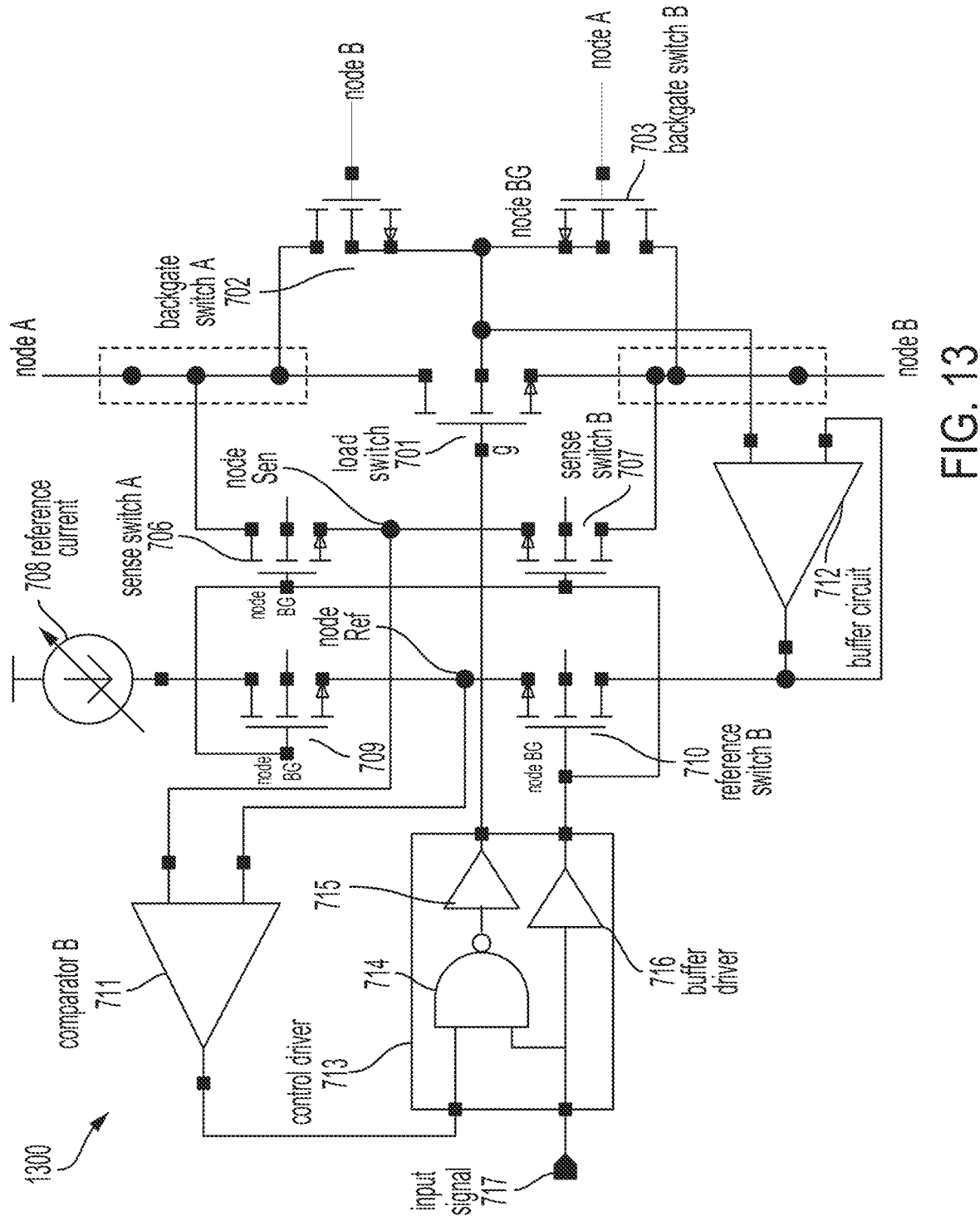
FIG. 13 is a non-limiting alternative embodiment of an over-current sensing circuit that can operate bi-directionally to detect an overcurrent event caused at either side of the conducting path through the load switch.

FIG. 13 illustrates an alternative to the configuration of FIG. 7. Specifically, the circuit 1300 of FIG. 13 differs from that of FIG. 7 in that the inverter 704 and comparator A 705 are omitted. Omission of these two components provides space savings, and improvements in supply current and response behavior, in at least some embodiments. In this configuration, the gate of 703 is connected to node A and gate of 702 is connected to node B.

The various sensing circuits in accordance with the various embodiments described herein may be provided within a single package configuration or separate packages, either with or without additional electronics. The components of the sensing circuits may also be formed in a single die within the integrated circuit package, or may be a separate die to provide enhanced isolation. Where a separate die is chosen, the die need not have a semiconductor substrate but may be another substrate chosen for its superior high impedance properties (e.g., glass or sapphire). Multiple dies may be provided within a single IC package as known to the person skilled in the art. In further variations, the sense switches, reference switches, and load switches need not be formed in the same package. However, it is advantageous that the sense switches are provided in the same package as the reference switches.

Figure 8:
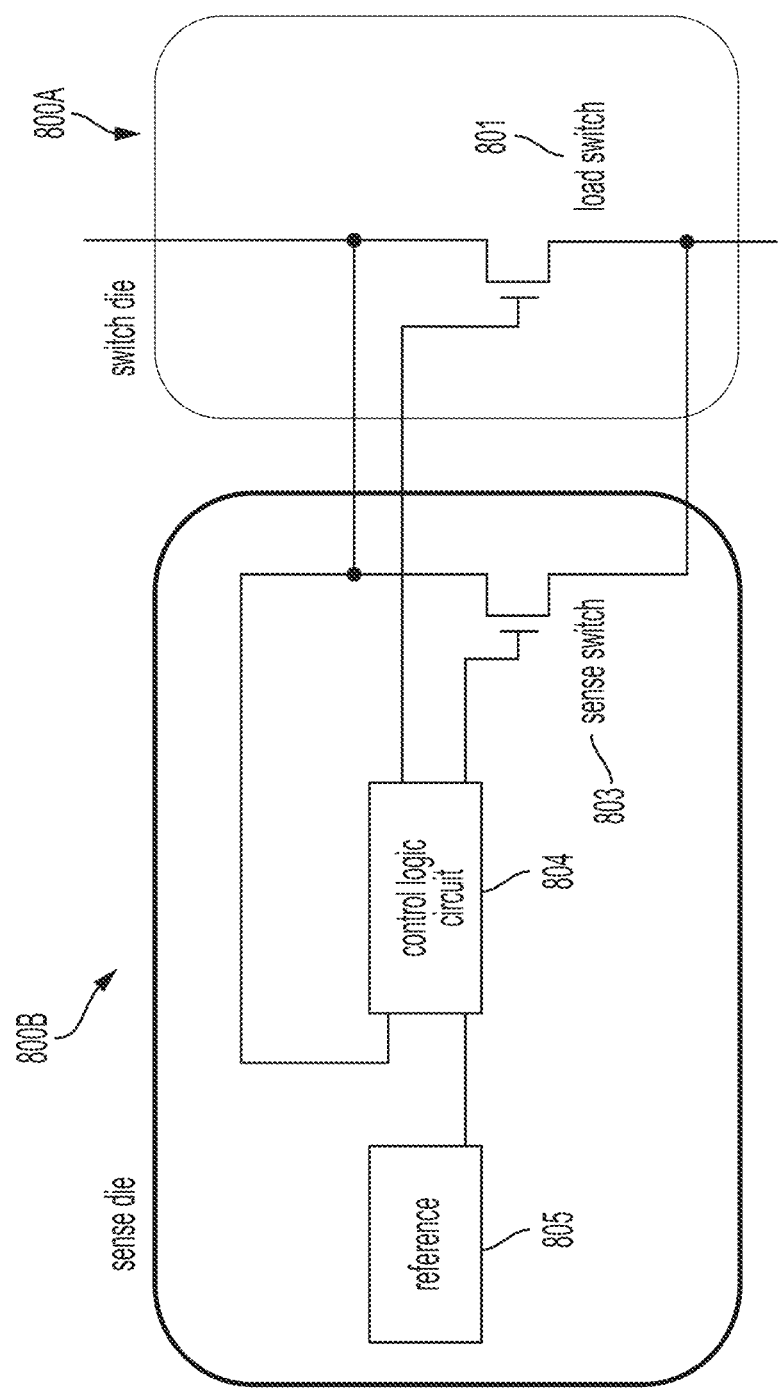
FIG. 8 is a non-limiting embodiment of an over-current sensing circuit that is on a separate die than the load switch circuit.

FIG. 8 shows a non-limiting embodiment based on FIG. 1A that demonstrates a modular approach to a sensing circuit using a two-die solution. The embodiment in FIG. 8 operates substantially the same as the embodiment illustrated in FIG. 1A except the components are not all fabricated on a common die. Instead, load switch 801 is fabricated in one die package (switch die 800A) and sense switch 803, control logic 804, and reference source 805 are fabricated in another die package (sensing die 800B). Though control logic 804 and reference source 805 are shown as being fabricated on switch die 802, either or both can be external to switch die 802.

Figure 9:
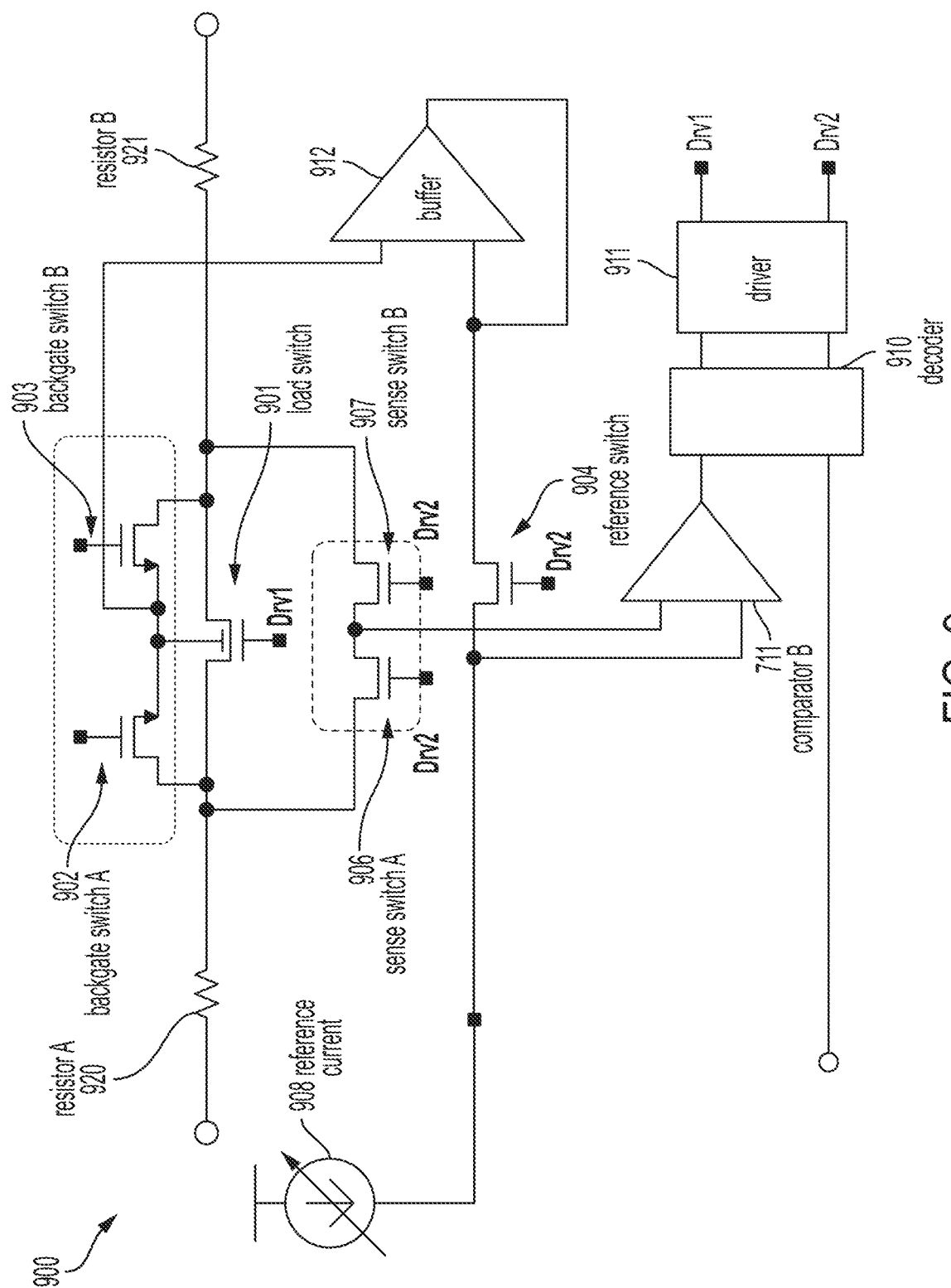
FIG. 9 is a non-limiting alternative embodiment of an over-current sensing circuit that can operate bi-directionally.

FIG. 9 shows a further non-limiting alternative embodiment of bi-directional over-current sensing circuit 900, which is the same as the in FIG. 7 except resistor A 920 and resistor B 921 have been added and control driver 713 has been replaced by decoder 910 and driver 911. In addition, cascode 709, inverter 704, and comparator A 705 have been removed. Though not illustrated for convenience, one output of control driver 913 (Drv1) is coupled to the gate of load switch 901; the other output of control driver 913 (Drv2) is coupled to the gates of sense switch A 906, sense switch B 907, and reference switch 904. One source/drain terminal of reference switch 904 is coupled to reference current 908, the other source/drain terminal of reference switch 904 is coupled to input terminal and the output terminal of buffer 912. The gates of backgate switch A 902 and backgate switch B 903 are coupled to complementary signals such that when backgate switch A 902 is in an on state, backgate switch B 903 is in an off state, and vice versa. Resistor A 920 is coupled to one source/drain terminal of load switch 901 and one source/drain terminal of sense switch A 906. Resistor A 920 is preferably sized to protect the components or circuits coupled to resistor A 920 by limiting the amount of current that can flow through resistor A 920 during a fault condition. Similarly, resistor B 921 is coupled to the source/drain terminal of load switch 901 and one source/drain terminal of sense switch B 907. Resistor B 921 is preferably sized to protect the components or circuits coupled to resistor B 921 by limiting the amount of current that can flow through resistor B 921 during a fault condition. For bi-directional sensing, sense switch A 906 is preferably sized to equal sense switch B 907 and resistor A 920 is preferably sized to equal resistor B 921. However, differences in device characteristics between sense switch A 906 and sense switch B 907, whether by design, manufacturing variability, or fluctuations occurring over time, can be accounted for with appropriate adjustments to resistor A 920 and resistor B 921, and vice versa.

Figure 10:
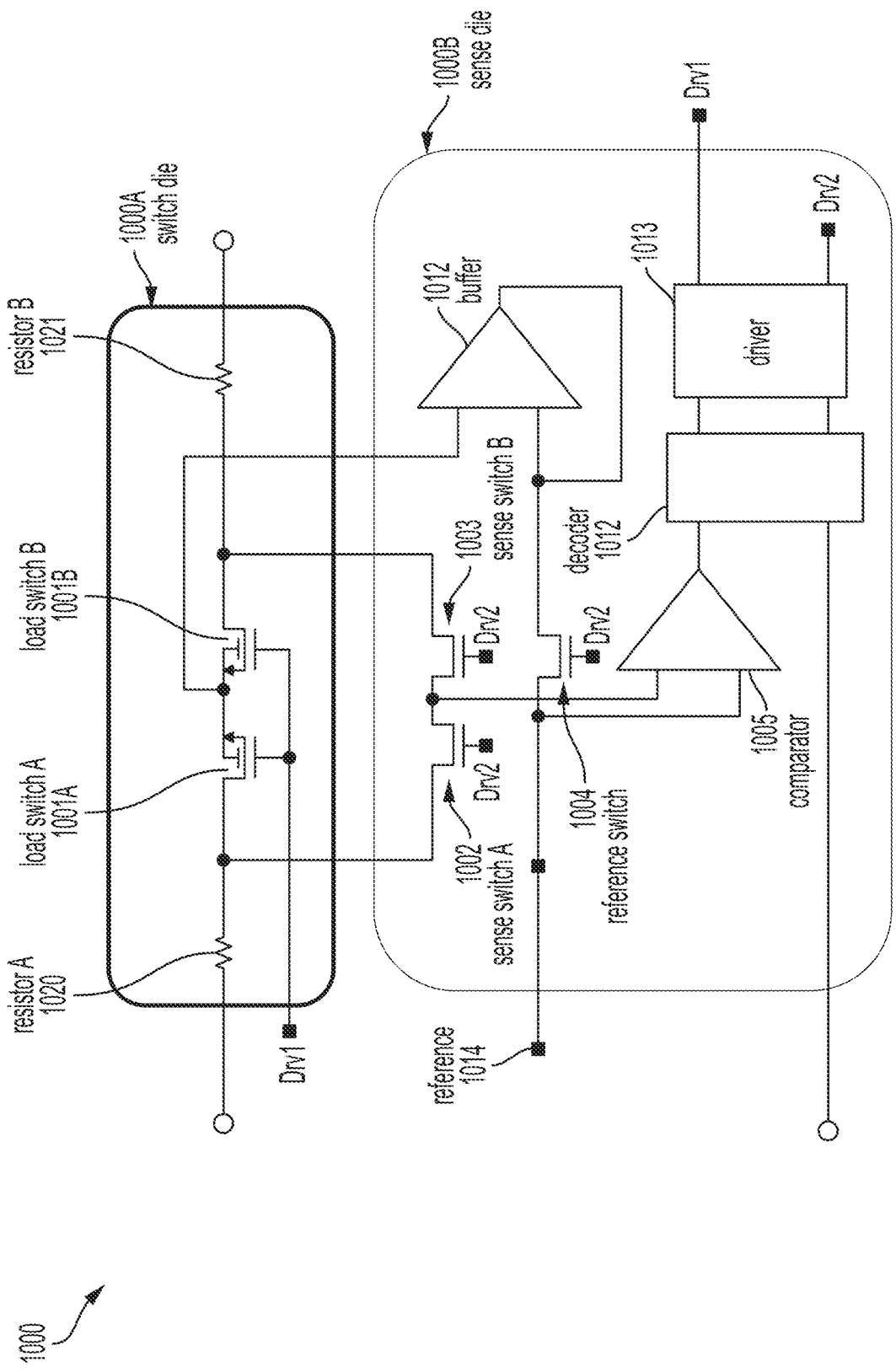
FIG. 10 is a non-limiting alternative embodiment of an over-current sensing circuit that can operate bi-directionally and is on a separate die from the load switch.

FIG. 10 shows a further non-limiting embodiment illustrating bi-directional sensing circuit 1000, which is based on the embodiment in FIG. 9 and the separate die configuration of FIG. 8. The fault condition sensing scheme for bi-directional sensing circuit as shown in FIG. 10 differs from that of FIG. 9 in that backgate switch A 902 and backgate switch B 903 are removed and load switch 901 has been replaced by load switch 1001A and load switch 1001B. Load switch A 1001A, load switch B 1001B, resistor A 1020, and resistor B 1021 are fabricated on one die (switch die 1000A). Sense switch A 1002, sense switch B 1003, reference switch 1004, comparator 1005, buffer 1012, decoder 1010, and driver 1013 are fabricated on another die (sense die 1000B). The gates of load switch 1001A and load switch 1001B are coupled to one output of driver 1013. The gates of sense switch A 1002, sense switch B 1003, and reference switch 1004 are coupled to the other output of driver 1013. Reference 1014, which is coupled to reference switch 1004 and comparator 1005, can be a reference current or reference voltage. Though Reference 1014 is illustrated as being generated external to sense die 1000B, it could be generated within sense die 1000B.

Figure 11:
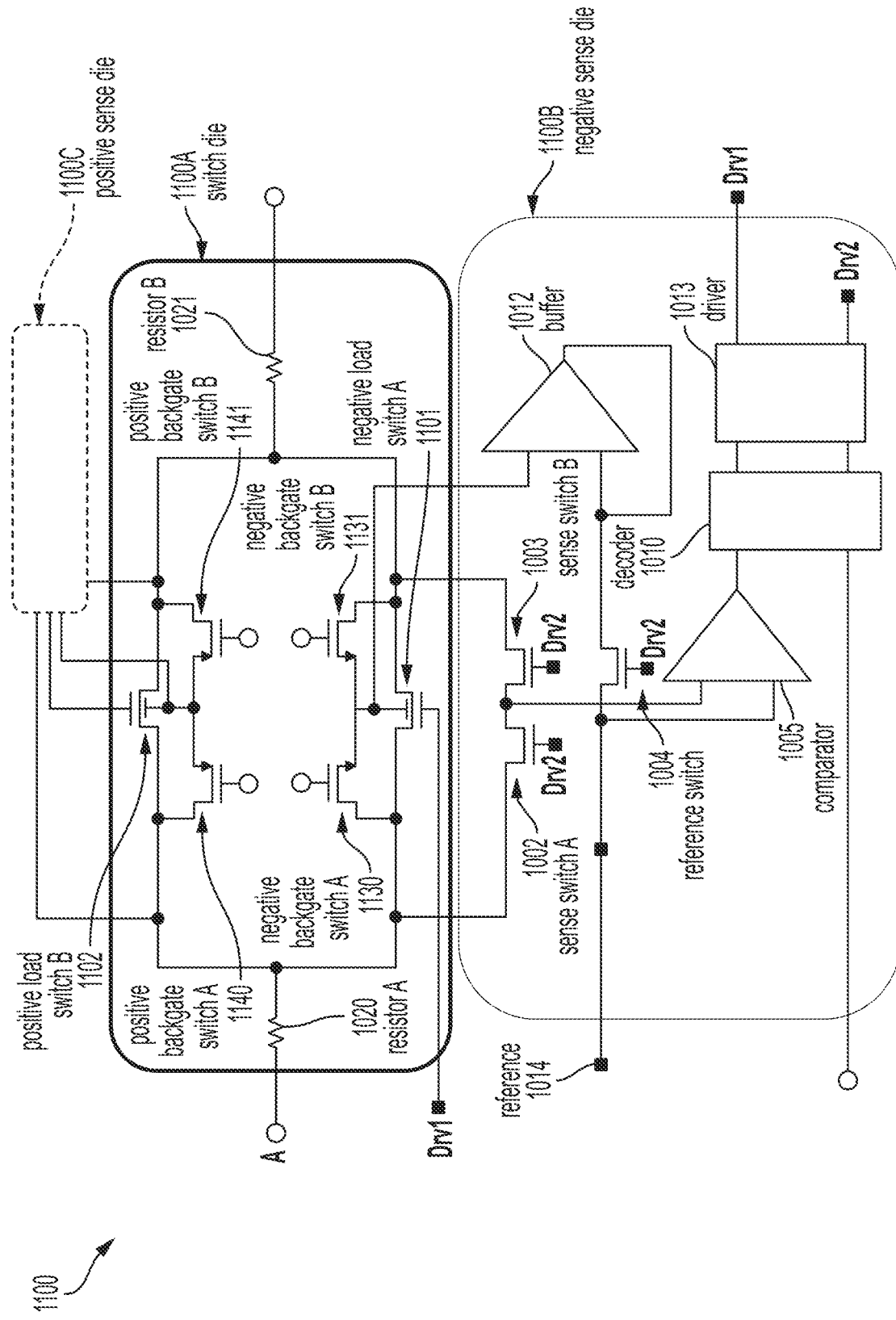
FIG. 11 is a non-limiting alternative embodiment of an over-current sensing circuit that can operate bi-directionally and is on a separate die from the load switch.

FIG. 11 shows a further non-limiting embodiment illustrating bi-directional sensing circuit 1100, which is based on the embodiment in FIG. 10. The fault condition sensing scheme for bi-directional sensing circuit as shown in FIG. 11 differs from that of FIG. 10 in that negative backgate switch A 1130, negative backgate switch B 1131, positive backgate switch A 1140, and negative backgate switch B 1141 have been added to switch die 1100A and the load switching is across negative load switch 1101 and positive load switch 1102, which are coupled in a parallel configuration.

One source/drain terminal of negative backgate switch A 1130 and one source/drain terminal of negative backgate switch B 1131 is coupled to the backgate terminal of negative load switch 1101 and negative sensing die 1100B. The other source/drain terminal of negative backgate switch A 1130 is coupled to one source/drain terminal of negative load switch 1101, resistor A 1020 and positive sensing die 1100B. The other source/drain terminal of negative backgate switch B 1111 is coupled to the other source/drain terminal of negative load switch 1101, resistor B 1121 and negative sensing die 1100B.

One source/drain terminal of positive backgate switch A 1140 and one source/drain terminal of positive backgate switch B 1141 is coupled to the backgate terminal of positive load switch 1102 and positive sensing die 1100C. The other source/drain terminal of positive backgate switch A 1140 is coupled to one source/drain terminal of positive load switch 1102, resistor A 1020 and positive sensing die 1100C. The other source/drain terminal of positive backgate switch B 1111 is coupled to the other source/drain terminal of positive load switch 1102, resistor B 1121, and positive sensing die 1100C, which operates substantially similar to negative sensing die 1100B.

Figure 12:
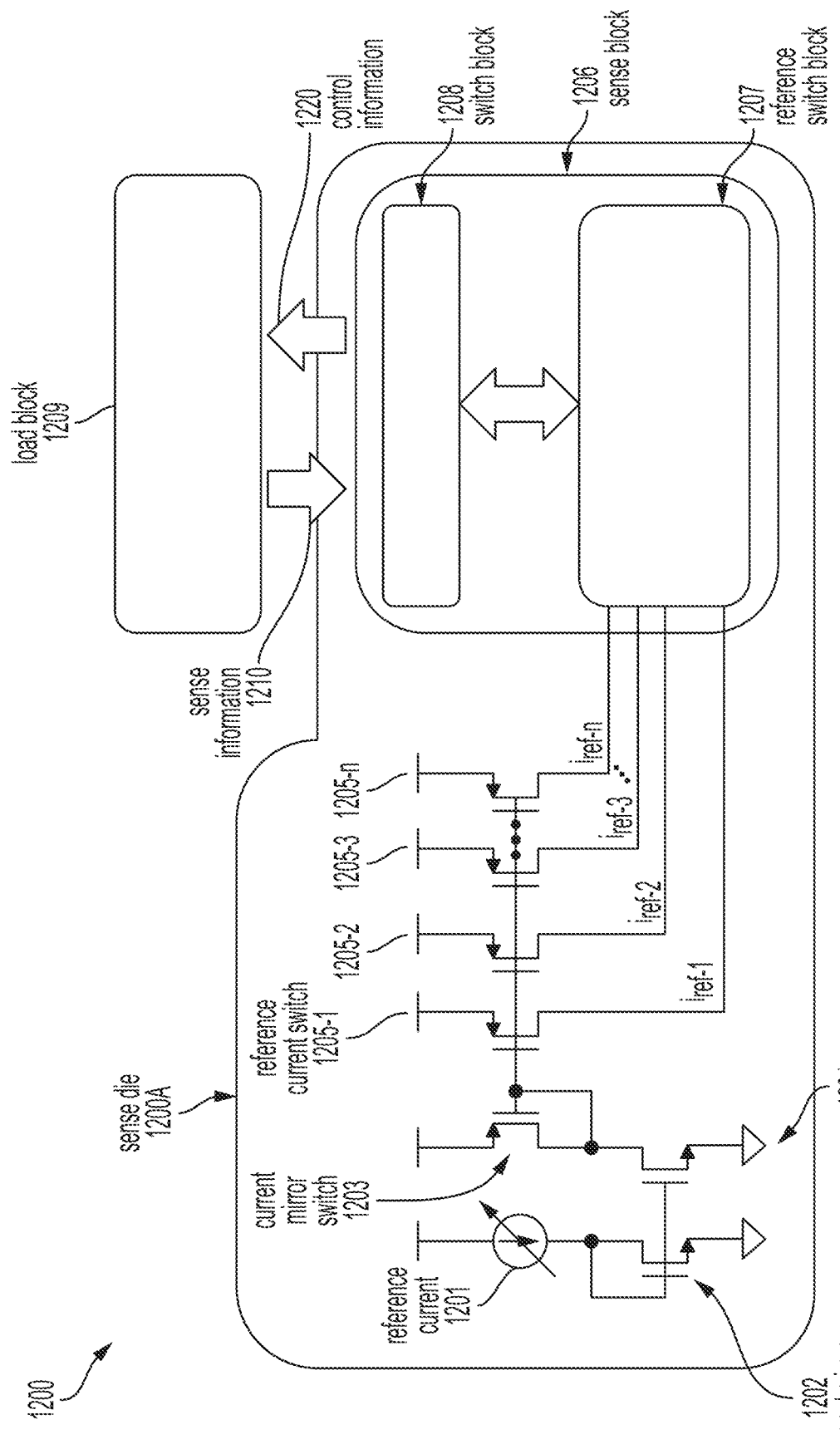
FIG. 12 is a non-limiting alternative embodiment of an over-current sensing circuit that is on a separate die from the load switch circuit.

FIG. 12 shows a further non-limiting embodiment illustrating an over-current sensing circuit that is on a separate die from the load switch circuit. Sense die 1200A consists of reference current 1201, current mirror switch 1202, current mirror switch 1203, and current mirror switch 1204, a plurality of reference current switches 1205-1 through 1205-*n*, and sense block 1206. Sense block 1206 comprises reference switch block 1207, which preferably comprises up to n reference switches (not illustrated), and sensing switch block 1208, which preferably comprises up to n sensing switches (not illustrated). Reference die 1200B consists of a plurality of load block 1209, which preferably comprises load switches 1209-1 through 1209-*n* (not illustrated).

Reference current 1201 is coupled to one source/drain terminal of current mirror switch 1202. The other source/drain terminal is coupled of source/drain terminal of current mirror switch 1202 is coupled to ground, though any reference potential source can be used. The gate terminal of current mirror switch 1202 is coupled to reference current 1201 and the gate of current mirror switch 1204, thereby forming a current mirror such that the current through current mirror switch 1204 is the same as the current set by reference current 1201.

One source/drain terminal of current mirror switch 1204 is coupled to ground, though any reference potential can be used if the same reference potential as that coupled to current mirror switch 1202. The other source/drain terminal of current mirror switch 1204 is coupled to one source/drain terminal of current mirror switch 1203, the gate terminal of current mirror switch 1203, and the gate terminals of reference current switches 1205-1 through 1205-*n*. Thus, another current mirror is formed such that the current through reference current switches 1205-1 through 1205-*n* (labeled $i_{ref\text{-}1}$ through $i_{ref\text{-}n}$) are determined by reference current 1201.

Sense block 1206 is coupled to $i_{ref\text{-}1}$ through $i_{ref\text{-}n}$ and receives sense information 1210 from load block 1209 and provides control information 1220 to load block 1209 in response to sense information 1210. For example, reference currents $i_{ref\text{-}1}$ through $i_{ref\text{-}n}$ can be used by reference switch block 1206 to set the currents through reference switches 1206-1 through 1206-*n*, which are compared to the current through sensing switches 1207-1 through 1207-*n*. In order to detect a fault condition at one or more of load switches 1209-1 through 1209-*n* based on sense information 1210, according to the methods and techniques described in the embodiments described herein. When sense block 1206 detects a fault condition at one or more load switches, sense block 1206 will send one or more control signal to load block 1209 indicating the one or more load switches where a fault condition has been detected, which is information that can be used by control circuitry in, or external to, reference die 1200B to turn off the load switches with a fault condition.

Claims herein may be presented herein in single dependency format. However it is to be understood that each claim may multiply depend on any preceding claim of the same type provided that such an arrangement is not technically infeasible.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A circuit for sensing a fault condition in an electronic system, the circuit comprising:
   a load switch having a first terminal and a second terminal and configured to switchably conduct current between the first and second terminals of the load switch;
   a sense switch in parallel with the load switch and configured to switchably conduct current between the first and second terminals of the load switch;
   control circuitry having a first output coupled to the load switch and a second output distinct from the first output and coupled to the sense switch, wherein the control circuitry is configured to control a state of the load switch via the first output and to control a state of the sense switch via the second output; and
   a comparison circuit coupled to the sense switch and configured to produce a comparison signal indicative of a relative value of a voltage across the sense switch compared to a reference value,
   wherein the control circuitry is further configured to place the load switch in an off-state while keeping the sense switch in an on-state in response to the comparison signal exceeding a threshold value.

2. The circuit of claim 1, wherein an on-state resistance of the sense switch is at least 10 times greater than an on-state resistance of the load switch.

3. The circuit of claim 1, wherein the reference value is variable.

4. The circuit of claim 1, further comprising:
   a reference switch, wherein the reference value is determined by the reference switch.

5. The circuit of 4, further comprising:
   a buffer circuit coupled to the reference switch and the load switch, wherein the buffer circuit is configured to provide an electrical path for current through the reference switch that is not combined with current through the load switch.

6. The circuit of claim 1, wherein the comparison signal produced by the comparison indicates an over-current condition of the load switch when the voltage across the sense switch differs from the reference value by more than the threshold value.

7. The circuit of claim 1, wherein the load switch comprises one or more field effect transistors and the sense switch comprises one or more field effect transistors.

8. The circuit of claim 1, wherein the sense switch is a first sense switch, the comparison signals is a first comparison signal, the reference value is a first reference value, the threshold value is a first threshold value, the circuit further comprising:
   a second sense switch in series with the first sense switch configured to switchably conduct current, wherein the second sense switch is coupled to the comparison circuit;
   the first terminal of the load switch is configured to have the same electrical potential as a first terminal of the first sense switch;
   the second terminal of the load switch is configured to have the same electrical potential as a first terminal of the second sense switch;
   wherein the comparison circuit is further configured to produce a second comparison signal indicative of a relative value of a voltage across the second sense switch compared to a second reference value.

9. A circuit for sensing a fault condition in an electronic system, the circuit comprising:
   a load switch having a first terminal and a second terminal and configured to switchably conduct a first current between the first and second terminals of the load switch;
   a sense switch in parallel with the load switch and configured to switchably conduct a second current, the load switch and sense switch being configured such that the first and second currents are combined;
   control circuitry having a first output coupled to the load switch and a second output distinct from the first output and coupled to the sense switch, wherein the control circuitry is configured to control a state of the load switch via the first output and to control a state of the sense switch via the second output; and a comparison circuit coupled to the sense switch and configured to produce a comparison signal indicative of relative value of a voltage across the sense switch compared to a reference value, wherein the control circuitry is further configured to place the load switch in an off-state while keeping the sense switch in an on-state in response to the comparison signal exceeding a threshold value.

10. The circuit of claim 9, wherein an on-state resistance of the sense switch is at least 10 times greater than an on-state resistance of the load switch.

11. The circuit of claim 9, wherein the reference value is variable.

12. The circuit of claim 9, further comprising:

a reference switch, wherein the reference value is determined by the reference switch.

13. The circuit of 12, further comprising:

a buffer circuit coupled to the reference switch and the load switch, wherein the buffer circuit is configured to provide an electrical path for current through the reference switch that is not combined with current through the load switch.

14. The circuit of claim 9, wherein the comparison signal produced by the comparison circuit indicates an over-current condition of the load switch when the voltage across the sense switch differs from the reference value by more than the threshold value.

15. The circuit of claim 9, wherein the load switch comprises one or more field effect transistors and the sense switch comprises one or more field effect transistors.

16. The circuit of claim 9, wherein the sense switch is a first sense switch, the comparison signals is a first comparison signal, the reference value is a first reference value, the threshold value is a first threshold value, the circuit further comprising:

a second sense switch in series with the first sense switch configured to switchably conduct current, wherein the second sense switch is coupled to the comparison circuit;

the first terminal of the load switch is configured to have the same electrical potential as a first terminal of the first sense switch;

the second terminal of the load switch is configured to have the same electrical potential as a first terminal of the second sense switch;

wherein the comparison circuit is further configured to produce a second comparison signal indicative of a relative value of (a) a voltage across the second sense switch compared to (b) a second reference value.

17. A method for sensing a fault condition in an electronic system, the method comprising:

switchably conducting current between a first terminal and a second terminal of a load switch through the load switch;

switchably conducting current between the first and second terminals of the load switch through a sense switch;

producing a comparison value by comparing a voltage across the sense switch and a reference voltage; and in response to the comparison value exceeding a threshold value, placing the load switch in an off-state while keeping the sense switch in an on-state.

18. The method of claim 17, wherein the reference voltage is variable.

19. The method of claim 17, further comprising:

producing the reference voltage with a reference switch.

20. The method of claim 17, further comprising, in response to the comparison value falling below the threshold value and subsequent to placing the load switch in the off-state, controlling the load switch to return to an on-state while keeping the sense switch in the on-state.

* * * * *